(12) United States Patent
Wu et al.

(10) Patent No.: US 9,620,176 B2
(45) Date of Patent: Apr. 11, 2017

(54) ONE-TIME PROGRAMMABLE MEMORY ARRAY HAVING SMALL CHIP AREA

(71) Applicant: eMemory Technology Inc., Hsin-Chu (TW)

(72) Inventors: Meng-Yi Wu, Hsinchu County (TW); Wei-Zhe Wong, Hsinchu County (TW); Hsin-Ming Chen, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/246,555

(22) Filed: Aug. 25, 2016

(65) Prior Publication Data

US 2017/0076757 A1 Mar. 16, 2017

Related U.S. Application Data

(60) Provisional application No. 62/216,378, filed on Sep. 10, 2015.

(51) Int. Cl.
*G11C 5/10* (2006.01)
*G11C 17/16* (2006.01)
*G11C 17/18* (2006.01)
*G11C 11/24* (2006.01)
*H01L 27/112* (2006.01)

(52) U.S. Cl.
CPC ............... *G11C 5/10* (2013.01); *G11C 11/24* (2013.01); *G11C 17/16* (2013.01); *G11C 17/18* (2013.01); *H01L 27/11206* (2013.01)

(58) Field of Classification Search
CPC .......... G11C 11/24; G11C 17/26; G11C 17/18
See application file for complete search history.

(56) References Cited

U.S. PATENT DOCUMENTS

| | | | |
|---|---|---|---|
| 2014/0340955 A1* | 11/2014 | Wu | H01L 27/11206 365/104 |
| 2015/0062998 A1* | 3/2015 | Nam | G11C 17/16 365/96 |
| 2015/0287730 A1* | 10/2015 | Wu | G11C 5/06 365/96 |

* cited by examiner

*Primary Examiner* — Tri Hoang
(74) *Attorney, Agent, or Firm* — Winston Hsu; Scott Margo

(57) ABSTRACT

A memory cell includes a first select transistor, a first following gate transistor, an antifuse transistor, a second following gate transistor, and a second select transistor. The first select transistor has a first terminal coupled to a bit line, a second terminal, and a gate terminal coupled to a word line. The first following gate transistor has a first terminal coupled to the second terminal of the first select transistor, a second terminal, and a gate terminal coupled to a following control line. The antifuse transistor has a first terminal coupled to the second terminal of the first following gate, and a gate terminal coupled to an antifuse control line. The second following gate transistor and the second select transistor are disposed symmetrically to the first following gate transistor and the second select transistor with respect to the antifuse transistor.

34 Claims, 12 Drawing Sheets

ONE-TIME PROGRAMMABLE MEMORY ARRAY HAVING SMALL CHIP AREA

CROSS REFERENCE TO RELATED APPLICATIONS

This non-provisional application claims priority of U.S. provisional application No. 62/216,378, filed on Sep. 10, 2015, included herein by reference in its entirety.

BACKGROUND OF THE INVENTION

1. Field of the Invention

This invention relates to a memory array, and more particularly, a one-time programmable memory array having small chip area.

2. Description of the Prior Art

Non-volatile memory (NVM) is a type of memory that retains information it stores even when no power is supplied to memory blocks thereof. Some examples include magnetic devices, optical discs, flash memory, and other semiconductor-based memory topologies. According to the programming times limit, non-volatile memory devices are divided into multi-time programmable (MTP) memory and one-time programmable (OTP) memory.

FIG. 1 shows a conventional OTP memory array 10 of prior art. The memory array 10 includes a plurality of memory cells 100, each including a select transistor 110, a following gate transistor 120 and an antifuse transistor 130. The select transistor 110 is used to select the memory cell to be programmed. To avoid the select transistor 110 from being broken down due to the high voltage when programming the memory cell 100, the following gate transistor 120 is added between the antifuse transistor 130 and the select transistor 110. When programming the memory cell 100, the antifuse transistor 130 is ruptured and behaves as a metal-oxide-semiconductor capacitor, such that data of logic "1" can be written into the OTP memory cell 100.

FIG. 2 shows a layout of the OTP memory cells 100. In FIG. 2, the two memory cells 100 are disposed in two different active areas AA1 and AA2 respectively. Also, due to the design rule of the layout, isolation structures, such as dummy poly PO and poly over diffusion edge PODE, are added between the active areas for the stability of the manufacturing process. Similarly, all the OTP memory cells 100 of the OTP memory array 10 are disposed in different active areas. Therefore, the dummy isolation structures can be found everywhere in the layout of the OTP memory array, which largely increases the chip area required by the OTP memory array 10. Thus, how to use the chip area more efficiently and design a memory array with small chip area has become an issue to be solved.

SUMMARY OF THE INVENTION

One embodiment of the present invention discloses a memory cell. The memory cell includes a first select transistor, a first following gate transistor, an antifuse transistor, a second following gate transistor, and a second select transistor.

The first select transistor has a first terminal coupled to a bit line, a second terminal, and a gate terminal coupled to a word line. The first following gate transistor has a first terminal coupled to the second terminal of the first select transistor, a second terminal, and a gate terminal coupled to a following control line. The antifuse transistor has a first terminal coupled to the second terminal of the first following gate transistor, a second terminal, and a gate terminal coupled to an antifuse control line. The second following gate transistor has a first terminal coupled to the second terminal of the antifuse transistor, a second terminal, and a gate terminal coupled to the following control line. The second select transistor has a first terminal coupled to the second terminal of the second following gate transistor, a second terminal coupled to the bit line, and a gate terminal coupled to the word line.

Another embodiment of the present invention discloses a memory array. The memory array includes a plurality of memory cells, each includes a first select transistor, a first following gate transistor, an antifuse transistor, a second following gate transistor, and a second select transistor.

The first select transistor has a first terminal coupled to a bit line, a second terminal, and a gate terminal coupled to a word line. The first following gate transistor has a first terminal coupled to the second terminal of the first select transistor, a second terminal, and a gate terminal coupled to a following control line. The antifuse transistor has a first terminal coupled to the second terminal of the first following gate transistor, a second terminal, and a gate terminal coupled to an antifuse control line. The second following gate transistor has a first terminal coupled to the second terminal of the antifuse transistor, a second terminal, and a gate terminal coupled to the following control line. The second select transistor has a first terminal coupled to the second terminal of the second following gate transistor, a second terminal coupled to the bit line, and a gate terminal coupled to the word line. Memory cells disposed in a same column are disposed in a same active area.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
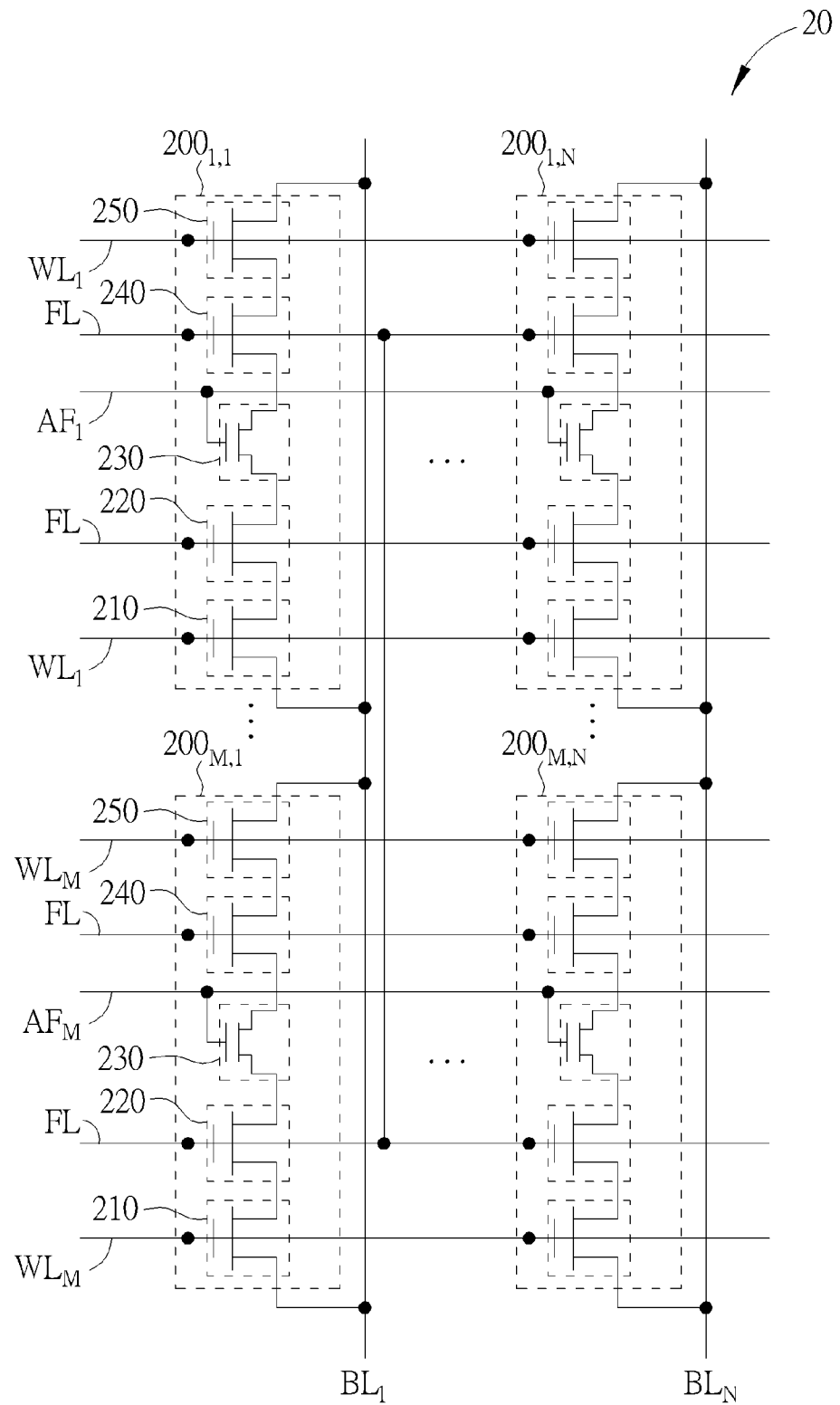
FIG. 3 shows a memory array according to one embodiment of the present invention.

FIG. 3 shows a memory array 20 according to one embodiment of the present invention. The memory array 20 includes M×N memory cells $200_{1,1}$ to $200_{M,N}$, where M and N are positive integers. Each memory cell $200_{1,1}$ to $200_{M,N}$ includes a first select transistor 210, a first following gate transistor 220, an antifuse transistor 230, a second following gate transistor 240, and a second select transistor 250.

The memory cells $200_{1,1}$ to $200_{M,N}$ have similar structures and operation principles. For example, the first select transistor 210 of the memory cell $200_{1,1}$ has a first terminal coupled to a bit line $BL_1$, a second terminal, and a gate terminal coupled to a word line $WL_1$. The first following gate transistor 220 of the memory cell $200_{1,1}$ has a first terminal coupled to the second terminal of the first select transistor 210 of the memory cell $200_{1,1}$, a gate terminal coupled to a following control line FL, and a second terminal. The antifuse transistor 230 of the memory cell $200_{1,1}$ has a first terminal coupled to the second terminal of the first following gate transistor 220 of the memory cell $200_{1,1}$, a gate terminal coupled to an antifuse control line $AF_1$, and a second terminal. The second following gate transistor 240 of the memory cell $200_{1,1}$ has a first terminal coupled to the second terminal of the antifuse transistor 230 of the memory cell $200_{1,1}$, a gate terminal coupled to the following control line FL, and a second terminal. The second select transistor 250 of the memory cell $200_{1,1}$ has a first terminal coupled to the second terminal of the second following gate transistor 240 of the memory cell $200_{1,1}$, a second terminal coupled to the bit line $BL_1$, and a gate terminal coupled to the word line $WL_1$.

Since the first select transistor 210 and the second select transistor 250 of the memory cell $200_{1,1}$ are coupled to the same word line $WL_1$, the first select transistor 210 and the second select transistor 250 of the memory cell $200_{1,1}$ are operated simultaneously. Also, since the first following gate transistor 220 and the second following gate transistor 240 of the memory cell $200_{1,1}$ are coupled to the same following control line FL, the first following gate transistor 220 and the second following gate transistor 240 of the memory cell $200_{1,1}$ are operated simultaneously.

In addition, in FIG. 3, memory cells disposed in the same row are coupled to the same antifuse control line, the same following control line, the same word line, and different bit lines. For example, the memory cells $200_{1,1}$ to $200_{1,N}$ are disposed in the same row, and memory cells $200_{1,1}$ to $200_{1,N}$ are coupled to the same antifuse control line $AF_1$, the same following control line FL, and the same word line $WL_1$. Also, the memory cell $200_{1,1}$ is coupled to the bit line $BL_1$ while the memory cell $200_{1,N}$ is coupled to the bit line $BL_N$. Similarly, the memory cells $200_{M,1}$ to $200_{M,N}$ are disposed in the same row, and memory cells $200_{M,1}$ to $200_{M,N}$ are coupled to the same antifuse control line $AF_M$, the same following control line FL, and the same word line $WL_M$. Also, the memory cell $200_{M,1}$ is coupled to the bit line $BL_1$ while the memory cell $200_{M,N}$ is coupled to the bit line $BL_N$.

Figure 4:
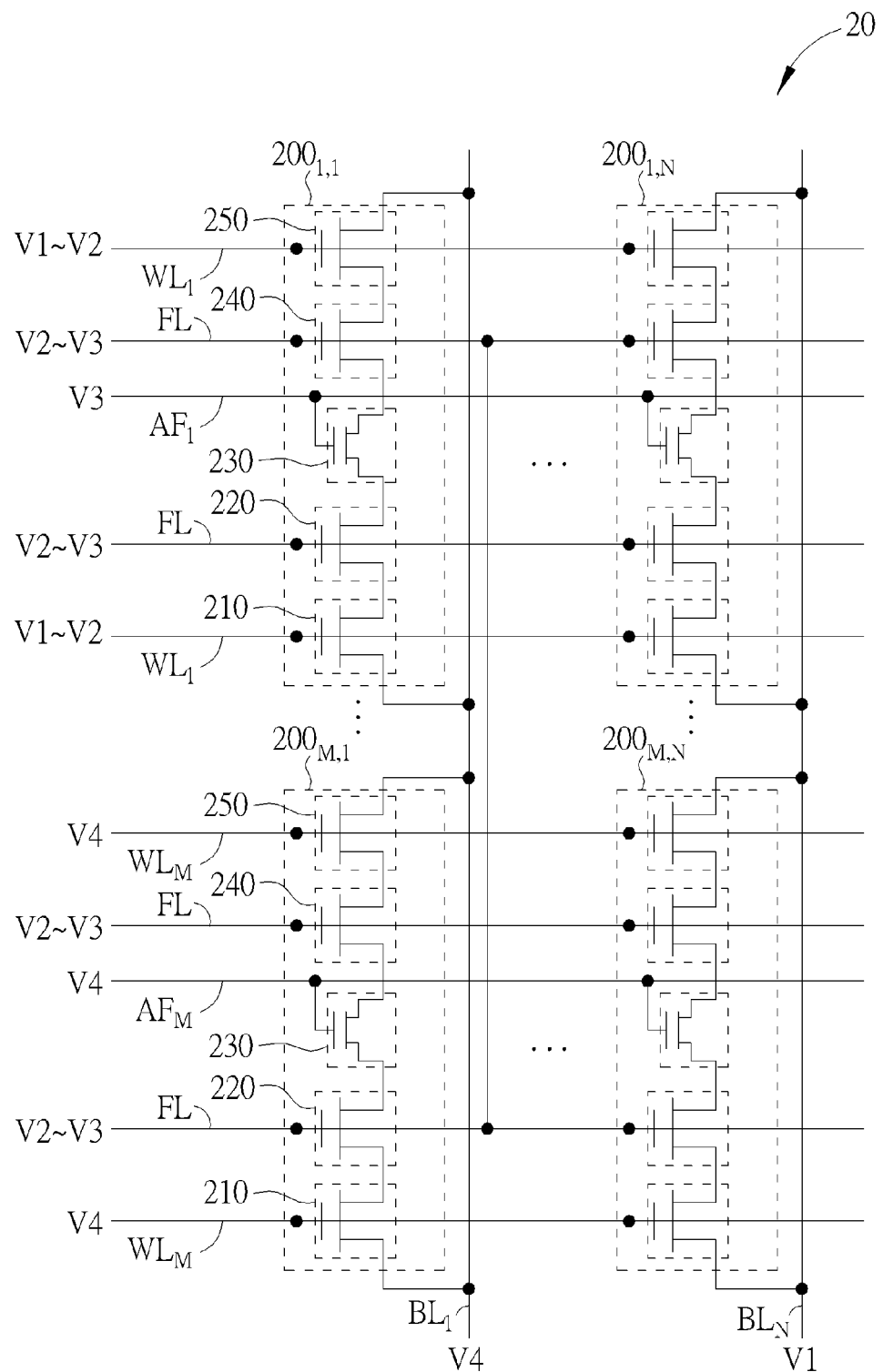
FIG. 4 shows voltages of the control lines coupled to the memory cells of the memory array of FIG. 3 during the program operation of a memory cell.

Furthermore, memory cells disposed in the same column are coupled to different antifuse control lines, different word lines, the same following control line, and the same bit line. For example, the memory cells $200_{1,1}$ to $200_{M,1}$ are disposed in the same column, the memory cell $200_{1,1}$ is coupled to the antifuse control line $AF_1$ and the word line $WL_1$, while the memory cell $200_{M,1}$ is coupled to the antifuse control line $AF_M$ and the word line $WL_M$. Also, the memory cell $200_{1,1}$ and the memory cell $200_{M,1}$ are coupled to the same the following control line FL and the same bit line $BL_1$. Similarly, the memory cells $200_{1,N}$ to $200_{M,N}$ are disposed in the same column, the memory cell $200_{1,N}$ is coupled to the antifuse control line $AF_1$ and the word line $WL_1$, while the memory cell $200_{M,N}$ is coupled to the antifuse control line $AF_M$ and the word line $WL_M$. Also, the memory cell $200_{1,N}$ and the memory cell $200_{M,N}$ are coupled to the same the following control line FL and the same bit line $BL_N$. In the present embodiment, memory cells $200_{1,1}$ to $200_{M,N}$ are coupled to the same following control line FL, however, the memory cells $200_{1,1}$ to $200_{M,N}$ can still be operated independently by other control lines. Although memory cells disposed in different rows can be coupled to different antifuse control lines as shown in FIG. 3, in some embodiments of the present invention, the antifuse control lines $AF_1$ to $AF_M$ may also be coupled together and be operated simultaneously. FIG. 4 shows voltages of the control lines coupled to the memory cells $200_{1,1}$ to $200_{M,N}$ during the program operation of the memory cell $200_{1,1}$. During the program operation of the memory cell $200_{1,1}$, the word line $WL_1$ can be in a range from a first voltage V1 to a second voltage V2, the following control line FL can be in a range from the second voltage V2 to a third voltage V3, the antifuse control line $AF_1$ can be at the third voltage V3, and the bit line $BL_1$ can be at a fourth voltage V4.

The third voltage V3 is greater than the second voltage V2, the second voltage V2 is greater than the first voltage V1, and the first voltage V1 is greater than the fourth voltage V4. In some embodiments, for memory array manufactured with the 16 nm process, the third voltage V3 can be 5V, the second voltage V2 can be 1.8V, the first voltage V1 can be 0.8V, and the fourth voltage V4 can be the ground voltage. However, in other embodiments, if the memory array is manufactured with other processes, the third voltage V3, the second voltage V2, the first voltage V1, and the fourth voltage V4 may have different values according to the requirement.

During the program operation of the memory cell $200_{1,1}$, the first select transistor 210, the first following gate transistor 220, the second following gate transistor 240, and the second select transistor 250 of the memory cell $200_{1,1}$ are turned on. Therefore, the antifuse transistor 230 of the memory cell $200_{1,1}$ will be ruptured by the high voltage difference between the antifuse control line $AF_1$ and the bit line $BL_1$, that is, the voltage difference between the third voltage V3 and the fourth voltage V4.

Also, during the program operation of the memory cell $200_{1,1}$, the memory cell $200_{1,N}$ disposed in the same row as the memory cell $200_{1,1}$ should not be programmed. Therefore, the bit line $BL_N$ coupled to the unselected memory cell $200_{1,N}$ can be at the first voltage V1. In this case, the voltage difference applied to the antifuse transistor 230 of the memory cell $200_{1,N}$ will not be high enough to rupture the antifuse transistor 230 of the memory cell $200_{1,N}$ and the memory cell $200_{1,N}$ will not be programmed.

Furthermore, during the program operation of the memory cell $200_{1,1}$, the memory cell $200_{M,1}$ disposed in the same column as the memory cell $200_{1,1}$ should not be programmed. Therefore, the word line $WL_M$ coupled to the unselected memory cell $200_{M,1}$ can be at the fourth voltage V4, and the antifuse control line $AF_M$ coupled to the unselected memory cell $200_{M,1}$ can be at the fourth voltage V4. In this case, since the antifuse control line $AF_M$ is at a low voltage, the memory cell $200_{M,1}$ will not be programmed.

Also, although the voltage of the antifuse control line $AF_1$ may be different from the voltage of the rest of the antifuse control lines, such as the antifuse control line $AF_M$ as shown in FIG. 4 during the program operation of the memory cell $200_{1,1}$, the antifuse control lines $AF_1$ to $AF_M$ may also be set to be at the same voltage in some embodiments of the present invention. That is, the antifuse control lines $AF_1$ to $AF_M$ can be coupled together and be operated simultaneously. In this case, since the word line $WL_M$ is still at the fourth voltage V4, the unselected memory cell $200_{M,1}$ will not be programmed. Furthermore, the other unselected memory cells disposed in different columns from the memory cell $200_{1,1}$, such as the memory cell $200_{M,N}$, may apply the same operation as the memory cell $200_{1,N}$ in this case.

Figure 5:
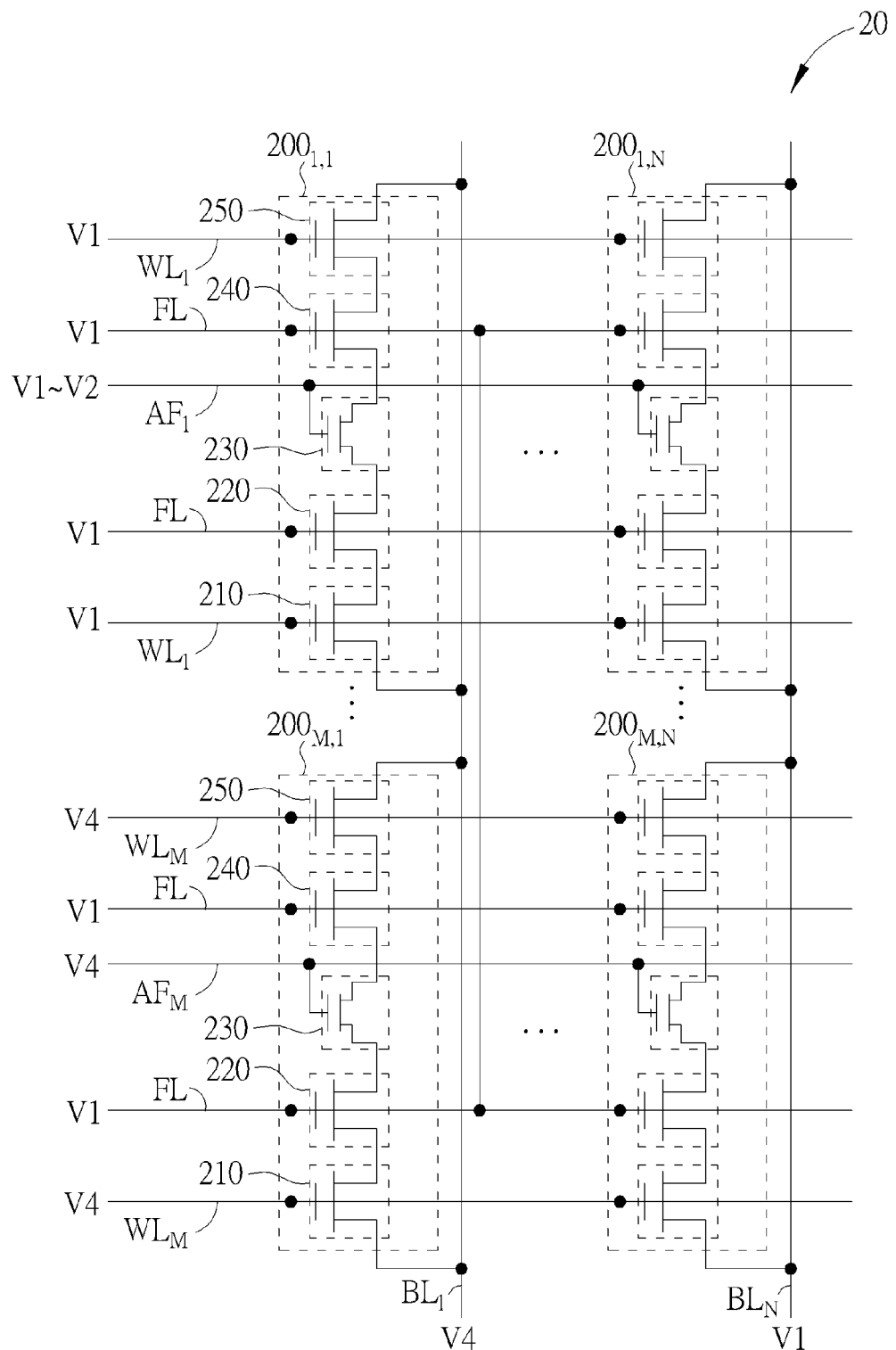
FIG. 5 shows voltages of the control lines coupled to the memory cells of the memory array of FIG. 3 during the read operation of a memory cell.

FIG. 5 shows voltages of the control lines coupled to the memory cells $200_{1,1}$ to $200_{M,N}$ during the read operation of the memory cell $200_{1,1}$. During a read operation of the memory cell $200_{1,1}$, the word line $WL_1$ is at a first voltage V1, the following control line FL can be at the first voltage V1, the antifuse control line $AF_1$ can be in a range from the first voltage V1 to the second voltage V2, and the bit line $BL_1$ can be at a fourth voltage V4. In this case, the first select transistor 210, the first following gate transistor 220, the second following gate transistor 240, and the second select transistor 250 of the memory cell $200_{1,1}$ are turned on so that the data stored in the antifuse transistor 230 of the memory cell $200_{1,1}$ can be read from the bit line $BL_1$.

Also, during the read operation of the memory cell $200_{1,1}$, the memory cell $200_{1,N}$ disposed in the same row as the memory cell $200_{1,1}$ may not be read. Therefore, during the read operation of the memory cell $200_{1,1}$, the bit line $BL_N$ coupled to the unselected memory cell $200_{1,N}$ can be at the first voltage V1. In this case, the first select transistor 210, the first following gate transistor 220, the second following gate transistor 240, and the second select transistor 250 of the memory cell $200_{1,N}$ can be turned off so that the data stored in the antifuse transistor 230 of the memory cell $200_{1,N}$ will not be read from the bit line $BL_N$.

Furthermore, during the read operation of the memory cell $200_{1,1}$, the memory cell $200_{M,1}$ disposed in the same column as the memory cell $200_{1,1}$ should not be read. Therefore, during the read operation of the memory cell $200_{1,1}$, the word line $WL_M$ coupled to the unselected memory cell $200_{M,1}$ can be at the fourth voltage V4, and the antifuse control line $AF_M$ coupled to the unselected memory cell $200_{M,1}$ can be at the fourth voltage V4. In this case, the first select transistor 210 and the second select transistor 250 of the memory cell $200_{M,1}$ can be turned off so that the data stored in the antifuse transistor 230 of the memory cell $200_{M,1}$ will not be read from the bit line $BL_1$.

Also, although the voltage of the antifuse control line $AF_1$ may be different from the voltage of the rest of the antifuse control lines, such as the antifuse control line $AF_M$ as shown in FIG. 5 during the read operation of the memory cell $200_{1,1}$, the antifuse control lines $AF_1$ to $AF_M$ may also be set to be at the same voltage in some embodiments of the present invention. That is, the antifuse control lines $AF_1$ to $AF_M$ can be coupled together and be operated simultaneously. In this case, since the word line $WL_M$ is still at the fourth voltage V4, the unselected memory cell $200_{M,1}$ will not be read. Furthermore, the other unselected memory cells disposed in different columns from the memory cell $200_{1,1}$, such as the memory cell $200_{M,N}$, may apply the same operation as the memory cell $200_{1,N}$ in this case.

Figure 6:
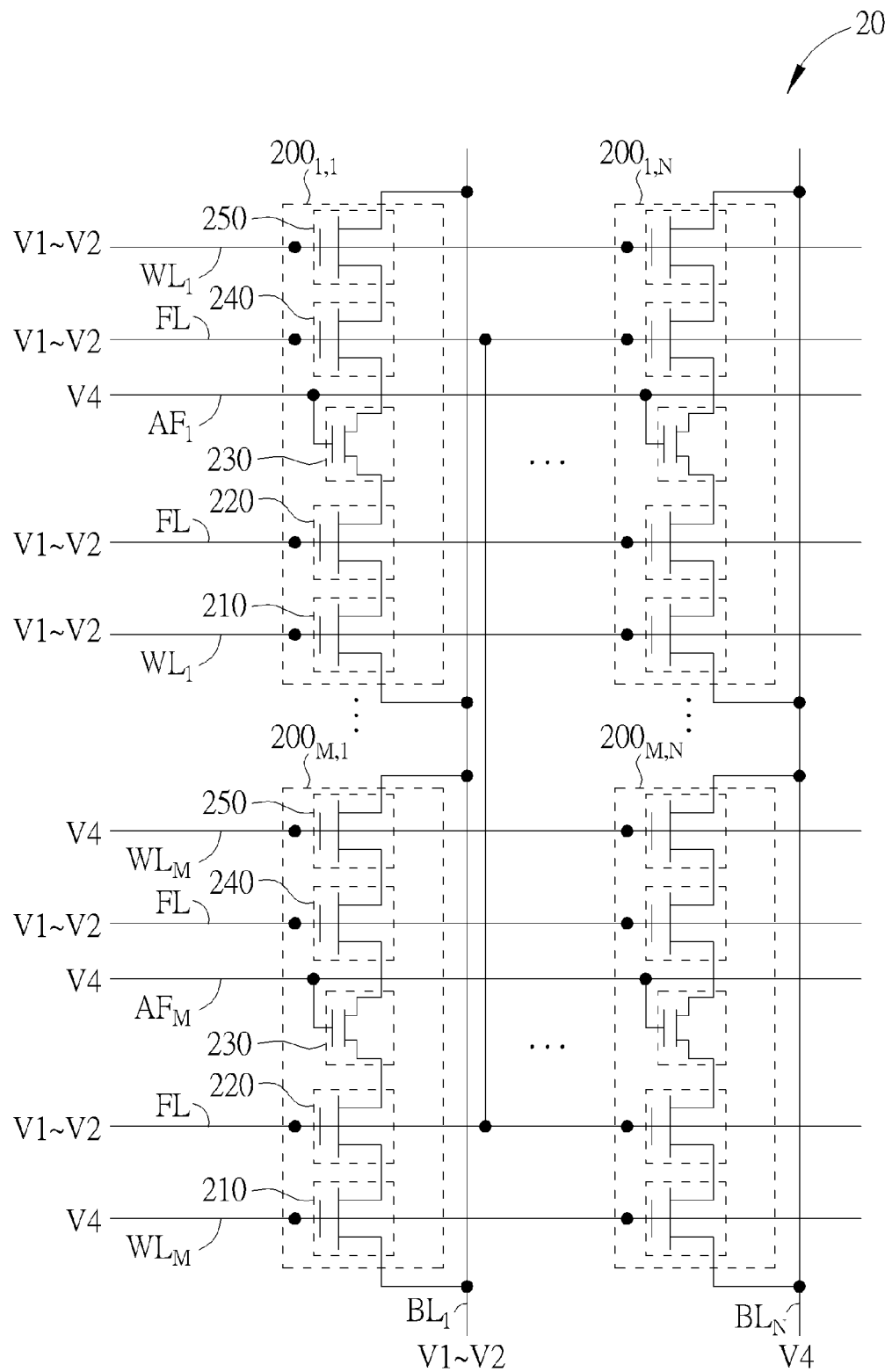
FIG. 6 shows voltages of the control lines coupled to the memory cells of the memory array of FIG. 3 during the reverse read operation of a memory cell.

In some embodiments, the memory array may support reverse read operations for reading the data in the memory cell. FIG. 6 shows voltages of the control lines coupled to the memory cells $200_{1,1}$ to $200_{M,N}$ during the reverse read operation of the memory cell $200_{1,1}$. During the reverse read operation of the memory cell $200_{1,1}$, the word line $WL_1$ can be in a range from the first voltage V1 to the second voltage V2, the following control line FL can be in a range from the first voltage V1 to the second voltage V2, the antifuse control line $AF_1$ can be at the fourth voltage V4, and the bit line $BL_1$ can be in a range from the first voltage V1 to the second voltage V2. In this case, the first select transistor 210, the first following gate transistor 220, the second following gate transistor 240, and the second select transistor 250 of the memory cell $200_{1,1}$ are turned on so that the data stored in the antifuse transistor 230 of the memory cell $200_{1,1}$ can be read from the bit line $BL_1$.

Also, during the reverse read operation of the memory cell $200_{1,1}$, the memory cell $200_{1,N}$ disposed in the same row as the memory cell $200_{1,1}$ should not be read. Therefore, during the reverse read operation of the memory cell $200_{1,1}$, the bit line $BL_N$ coupled to the unselected memory cell $200_{1,N}$ can be at the fourth voltage V4. In this case, the first select transistor 210, the first following gate transistor 220, the second following gate transistor 240, and the second select transistor 250 of the memory cell $200_{1,N}$ can be turned off so that the data stored in the antifuse transistor 230 of the memory cell $200_{1,N}$ will not be read from the bit line $BL_N$.

Furthermore, during the reverse read operation of the memory cell $200_{1,1}$, the memory cell $200_{M,1}$ disposed in the same column as the memory cell $200_{1,1}$ should not be read. Therefore, during the reverse read operation of the memory cell $200_{1,1}$, the word line $WL_M$ coupled to the unselected memory cell $200_{M,1}$ can be at the fourth voltage V4, and the antifuse control line $AF_M$ coupled to the unselected memory cell $200_{M,1}$ can be at the fourth voltage V4. In this case, the first select transistor 210 and the second select transistor 250 of the memory cell $200_{M,1}$ can be turned off so that the data stored in the antifuse transistor 230 of the memory cell $200_{M,1}$ will not be read from the bit line $BL_1$.

Also, in some embodiments, the antifuse control lines $AF_1$ to $AF_M$ can be coupled together and be operated simultaneously during the reverse read operation of the memory cell $200_{1,1}$. In this case, since the word line $WL_M$ is still at the fourth voltage V4, the unselected memory cell $200_{M,1}$ will not be read. Furthermore, the other unselected memory cells disposed in different columns from the memory cell $200_{1,1}$, such as the memory cell $200_{M,N}$, may apply the same operation as the memory cell $200_{1,N}$ in this case.

Since the first select transistor 210 and the first following gate transistor 220 are operated simultaneously with the second select transistor 250 and the second following gate transistor 240, the read current generated by each of the memory cells $200_{1,1}$ to $200_{M,N}$ of the memory array 20 can be outputted to the corresponding bit line through two different paths. Therefore, the gate width of the first select transistor 210, the gate width of the second select transistor 250, the gate width of the first following gate transistor 220, and the gate width of the second following gate transistor 240 can be smaller than the gate width of the select transistor 110 of prior art without affecting the driving ability. For example, by reducing the gate widths of the first select transistor 210, the second select transistor 250, the first following gate transistor 220, and the second following gate transistor 240 by 50%, the two current paths formed by the first select transistor 210, the first following gate transistor 220, the second following gate transistor 240, and the second select transistor 250 can still sustain the original driving ability.

Figure 7:
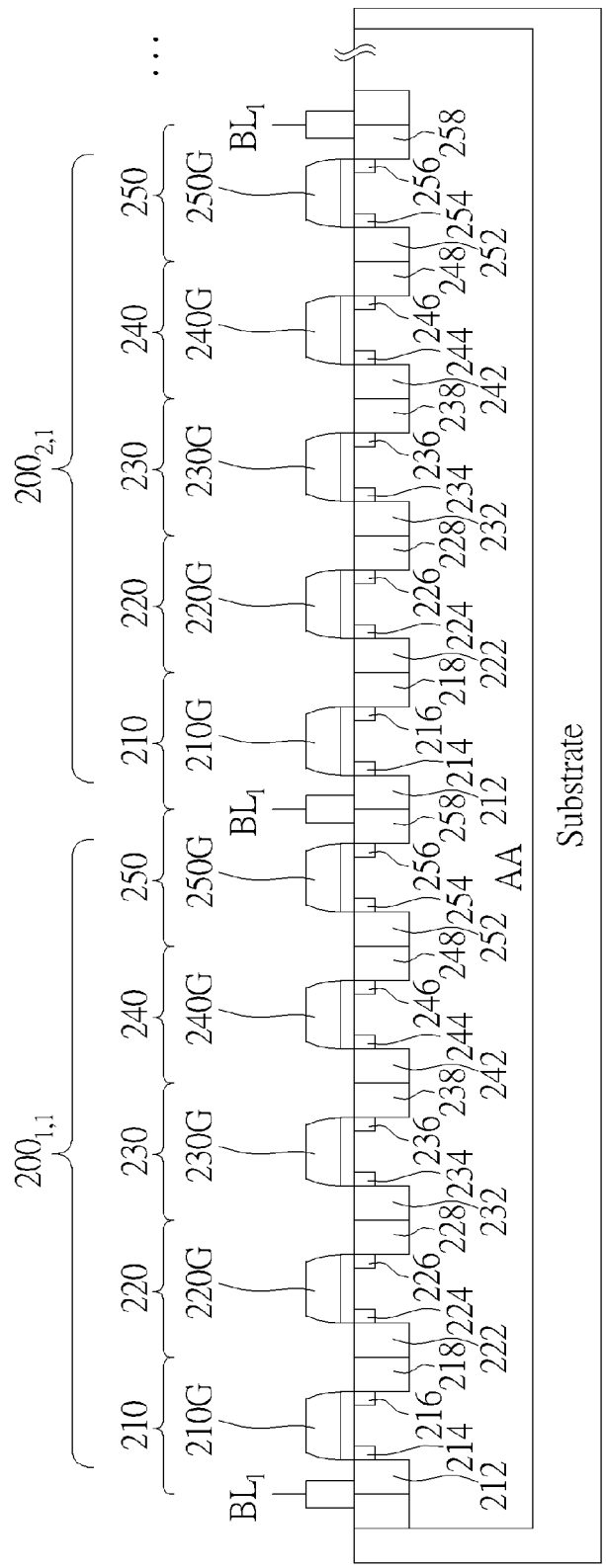
FIG. 7 shows structures of the memory cells of the memory array of FIG. 3 according to one embodiment of the present invention.
Figure 8:
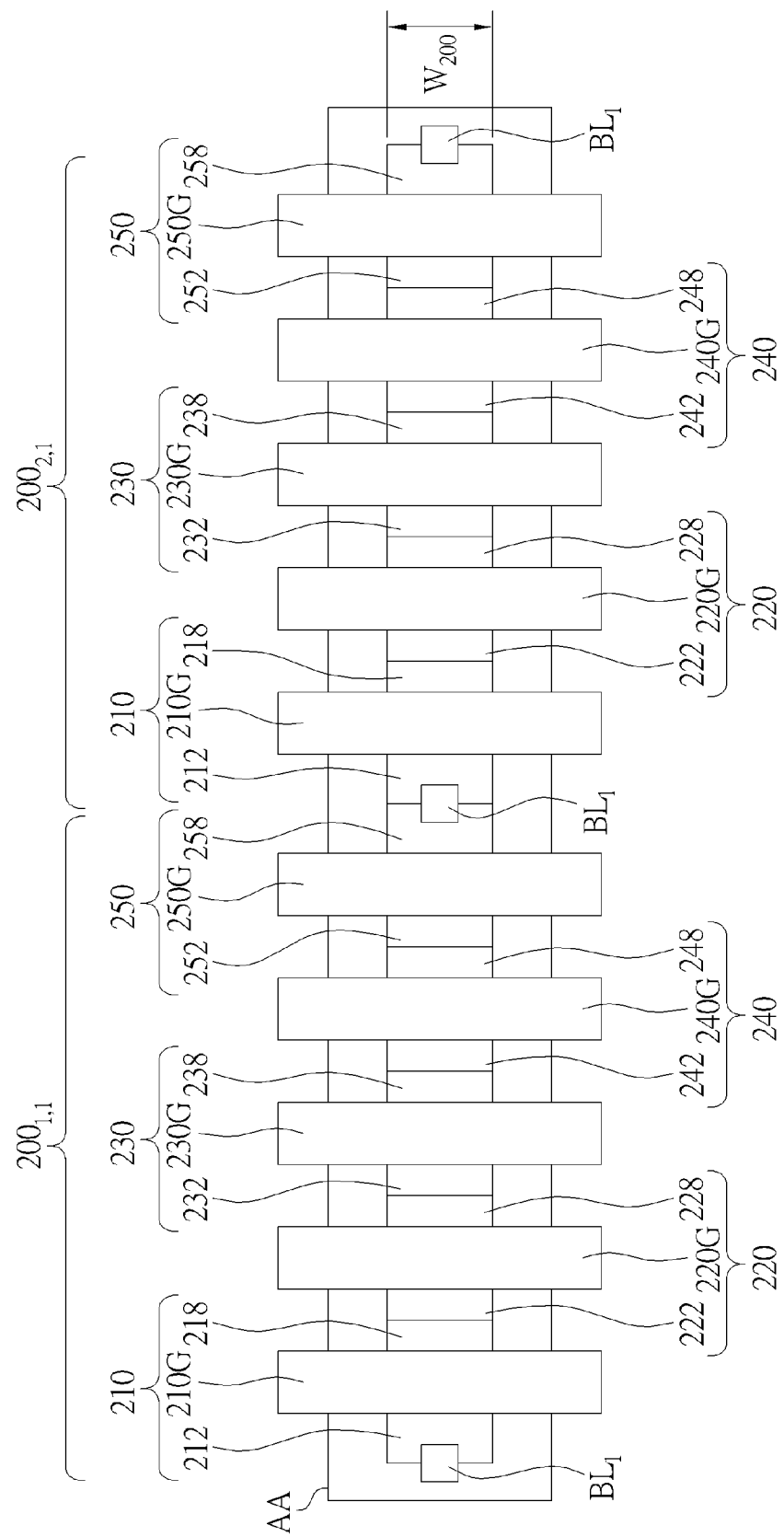
FIG. 8 shows a layout of the memory cells of FIG. 7 according to one embodiment of the present invention.

FIG. 7 shows structures of the memory cells $200_{1,1}$ and $200_{2,1}$ of the memory array 20 according to one embodiment of the present invention. The memory cells $200_{1,1}$ and $200_{2,1}$ have the same structures. FIG. 8 shows a layout of the memory cells $200_{1,1}$ and $200_{2,1}$ of the memory array 20.

In FIG. 7, the first select transistor 210 further includes a first source/drain extension region 214 coupled to the first terminal 212 of the first select transistor 210 and a second source/drain extension region 216 coupled to the second terminal 218 of the first select transistor 210. The first source/drain extension region 214 and the second source/drain extension region 216 of the first select transistor 210 are disposed below the gate terminal 210G of the first select transistor 210.

The first following gate transistor 220 further includes a first source/drain extension region 224 coupled to the first terminal 222 of the first following gate transistor 220, and a second source/drain extension region 226 coupled to the second terminal 228 of the first following gate transistor 220. The first source/drain extension region 224 and the second source/drain extension region 226 are disposed below the gate terminal 220G of the first following gate transistor 220.

The antifuse transistor 230 further includes a first source/drain extension region 234 coupled to the first terminal 232 of the antifuse transistor 230, and a second source/drain extension region 236 coupled the second terminal 238 of the antifuse transistor 230. The first source/drain extension region 234 and the second source/drain extension region 236 of the antifuse transistor 230 are disposed below the gate terminal 230G of the antifuse transistor 230.

The second following gate transistor 240 includes a first source/drain extension region 246 coupled to the second terminal 248 of the second following gate transistor 240, and a second source/drain extension region 244 coupled to the first terminal 242 of the second following gate transistor 240. The first source/drain extension region 246 and the second source/drain extension region 244 are disposed below the gate terminal 240G of the second following gate transistor 240.

The second select transistor 250 includes a first source/drain extension region 254 coupled to the first terminal 252 of the second select transistor 250 and a second source/drain extension region 256 coupled to the second terminal 258 of the second select transistor 250. The first source/drain extension region 254 and the second source/drain extension region 256 of the second select transistor 250 are disposed below the gate terminal 250G of the second select transistor 250.

Since the first terminal 212 of the first select transistor 210 and the second terminal 258 of the second select transistor 250 of the memory cell $200_{1,1}$ are both coupled to the bit line $BL_1$, the memory cell $200_{1,1}$ can be disposed in the same active area AA with other memory cells that are coupled to the same bit line $BL_1$. That is, memory cells disposed in the same column can all be disposed in the same active area. For example, since the memory cell $200_{2,1}$ to memory cell $200_{M,1}$ are also coupled to the bit line $BL_1$, the memory cell $200_{2,1}$ to memory cell $200_{M,1}$ can also be disposed in the same active area AA as the memory cell $200_{1,1}$.

Figure 1:
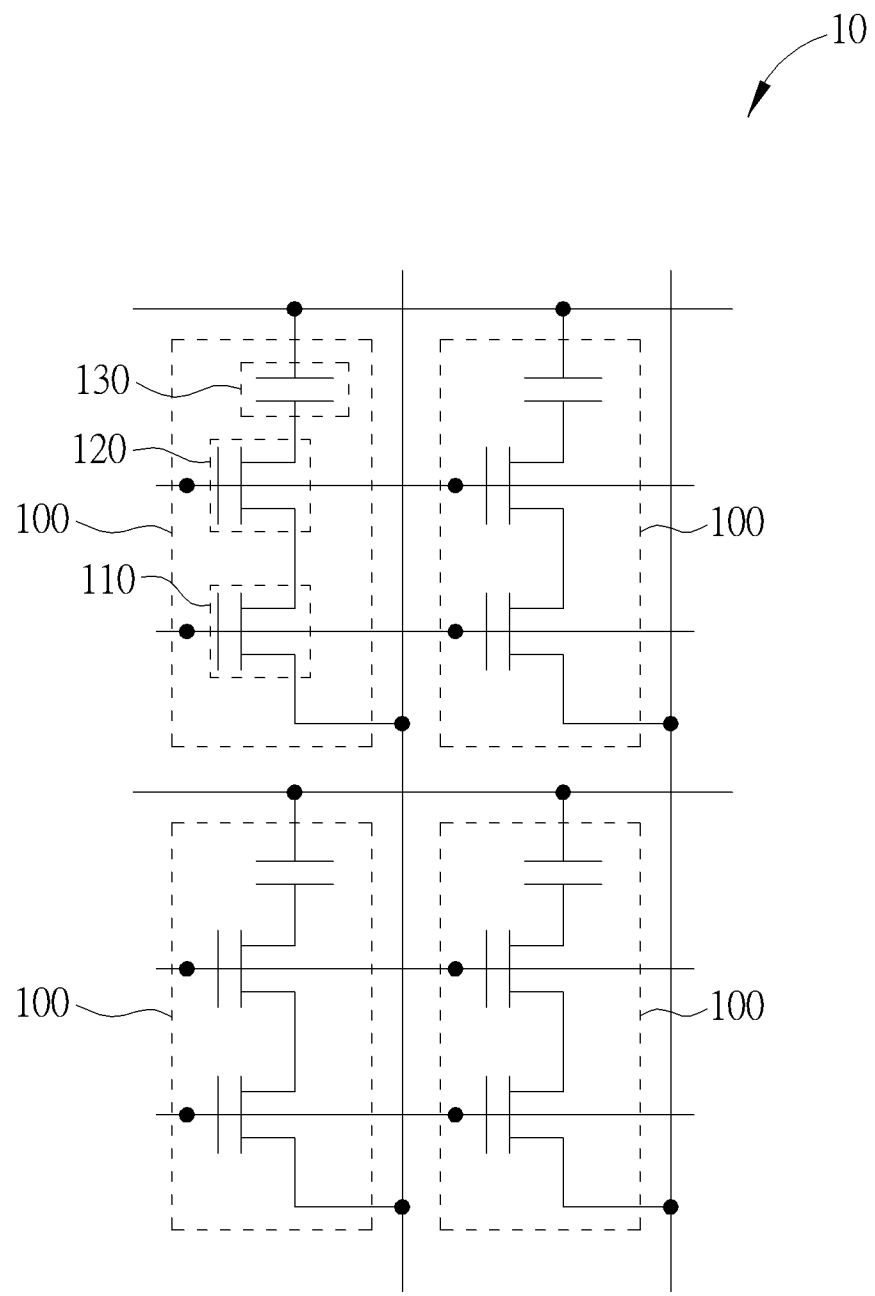
FIG. 1 shows a conventional one-time programmable memory array of prior art.
Figure 2:
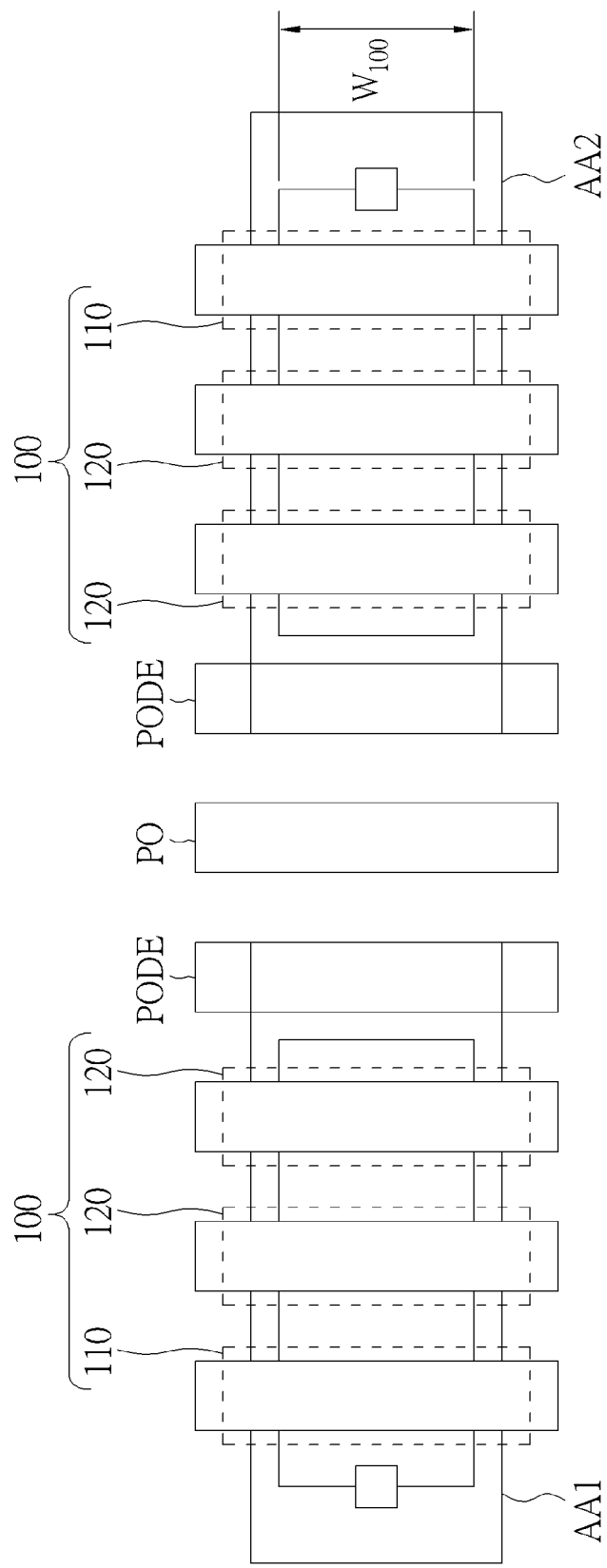
FIG. 2 shows a layout of the OTP memory cells of FIG. 1.

By sharing the same active area, most of the isolation structures, such as dummy poly or poly over diffusion edge used in the prior art, can be saved, and the memory array 20 can use the area efficiently. Although each of the memory cells $200_{1,1}$ to $200_{M,N}$ may include more transistors than the memory cell 100, the gate widths of the first select transistor 210, the second select transistor 250, the first following gate transistor 220 and the second following gate transistor 240 can be smaller than the gate widths of the select transistor 110 and the following gate transistor 120 of prior art. Therefore, the total chip area of the memory array 20 can still be reduced significantly. For example, the gate widths $W_{200}$ of the first select transistor 210, the second select transistor 250, the first following gate transistor 220 and the second following gate transistor 240 as shown in FIG. 8 can be 50% smaller than the gate widths $W_{100}$ of the select transistor 110 and the following gate transistor 120 as shown in FIG. 2. In this case, the area of the memory array 20 can be 30% smaller than the memory array of prior art without deteriorating the driving ability.

In some embodiments of the present invention, the first select transistor 210, the first following gate transistor 220, the second following gate transistor 240, and the second select transistor 250 are N-type metal-oxide-semiconductor transistors, and the antifuse transistor 230 is formed as a metal-oxide-semiconductor capacitor. In this case, the first terminal 212 and the second terminal 218 of the first select transistor 210, the first terminal 222 and the second terminal 228 of the first following gate transistor 220, the first terminal 232 and the second terminal 238 of the antifuse transistor 230, the first terminal 242 and the second terminal 248 of the second following gate transistor 240, the first terminal 252 and the second terminal 258 of the second select transistor 250 can be N-type doped sources or drains. Also, the source/drain extension regions 214, 216, 224, 226, 234, 236, 244, 246, 254, and 256 can be N-typed doped regions having lower doping density than the sources and drains.

The source/drain extension regions can help to reduce the punch through effect. However, since two current paths of each of the memory cell $200_{1,1}$ to $200_{M,N}$ are controlled by the first select transistor 210, the second select transistor 250, the first following gate transistor 220 and the second following gate transistor 240, the punch through effect on the antifuse transistor 230 can be avoided by the select transistors and the following gate transistors without adding first source/drain extension region 234 and the second source/drain extension region 236.

Figure 9:
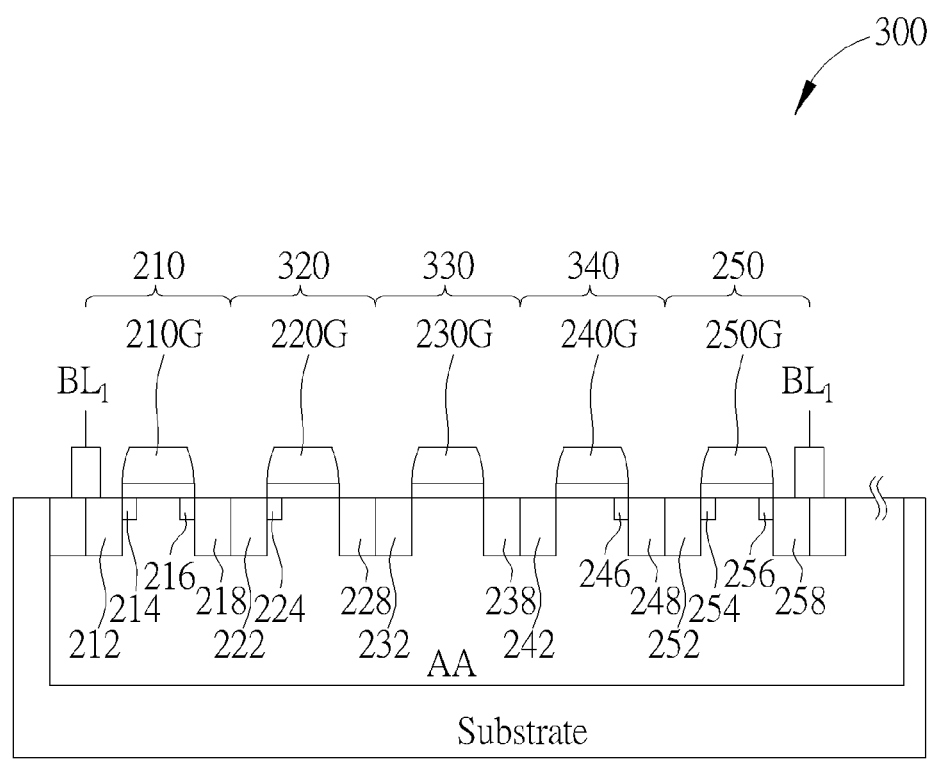
FIG. 9 shows a structure of the memory cell according to another embodiment of the present invention.

FIG. 9 shows a structure of the memory cell 300 according to one embodiment of the present invention. The memory cells 300 and $200_{1,1}$ have similar structures. The main difference between the two memory cells is in that the memory cell 300 includes the first select transistor 210, the first following gate transistor 320, the antifuse transistor 330, the second following gate transistor 340, and the second select transistor 250.

The first following gate transistor 320 includes the first source/drain extension region 224 coupled to the first terminal 222 of the first following gate transistor 320, but does not include the second source/drain extension region 226 as the first following gate transistor 220. The antifuse transistor 330 does not include the first source/drain extension region 234 and the second source/drain extension region 236. Also, The second following gate transistor 340 includes the first source/drain extension region 246 coupled to the second terminal 248 of the second following gate transistor 340, but does not include the second source/drain extension region 244 as the second following gate transistor 240.

By removing the source/drain extension regions near the antifuse transistor 330, the junction leakage current generated by the antifuse transistor 330 of the memory cell 300 can be reduced so as to reduce the power consumption of the memory cell 300.

Since both the first terminal 212 of the first select gate 210 and second terminal 258 of the second select gate 250 of the memory cell 300 are still coupled to the bit line $BL_1$, the memory cell 300 can be disposed in the same active area AA with other memory cells that are coupled to the same bit line $BL_1$. That is, memory cells disposed in the same column can still be disposed in the same active area. Therefore, when using the memory cell 300 to replace the memory cells $200_{1,1}$ to $200_{M,N}$ in the memory array 20, the total chip area can still be smaller than the memory array of prior art.

Figure 10:
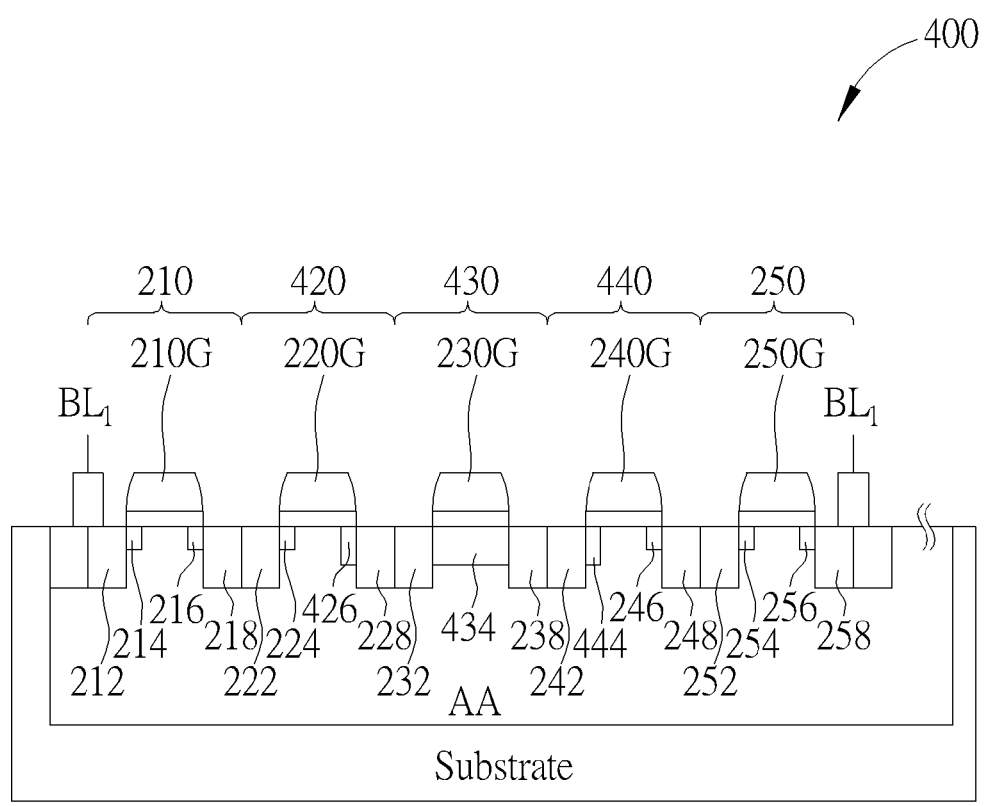
FIG. 10 shows a structure of the memory cell according to another embodiment of the present invention.

Furthermore, in some embodiments, some of the source/drain extension regions can be replaced by modified source/drain extension regions having even lower doping density than the source/drain extension regions. FIG. 10 shows a structure of the memory cell 400 according to one embodiment of the present invention. The memory cells 400 and $200_{1,1}$ have similar structures. The main difference between the two memory cells is in that the memory cell 400 includes the first select transistor 210, the first following gate transistor 420, the antifuse transistor 430, the second following gate transistor 440, and the second select transistor 250.

The first following gate transistor 420 includes the first source/drain extension region 224 coupled to the first terminal 222 of the first following gate transistor 420, and a modified source/drain extension region 426 coupled to the second terminal 228 of the first following gate transistor 420. The first source/drain extension region 224 and the modified source/drain extension region 426 are disposed below the gate terminal 220G of the first following gate transistor 420.

The antifuse transistor 430 include a modified source/drain extension region 434 coupled to the first terminal 232 and the second terminal 238 of the antifuse transistor 430. The modified source/drain extension region 434 is disposed below the gate terminal 230G of the antifuse transistor 430.

The second following gate transistor 440 includes the first source/drain extension region 246 coupled to the second terminal 248 of the second following gate transistor 440, and a modified source/drain extension region 444 coupled to the first terminal 242 of the second following gate transistor 440. The first source/drain extension region 246 and the modified source/drain extension region 444 are disposed below the gate terminal 240G of the second following gate transistor 440.

In this case, the antifuse transistor 430 is formed as an antifuse varactor. Also, since both the first terminal 212 of the first select gate 210 and second terminal 258 of the second select gate 250 of the memory cell 400 are still coupled to the bit line $BL_1$, the memory cell 400 can be disposed in the same active area AA with other memory cells that are coupled to the same bit line $BL_1$. That is, memory cells disposed in the same column can still be disposed in the same active area. Therefore, when using the memory cell 400 to replace the memory cells $200_{1,1}$ to $200_{M,N}$ in the memory array 20, the total chip area can still be smaller than the memory array of prior art.

Figure 11:
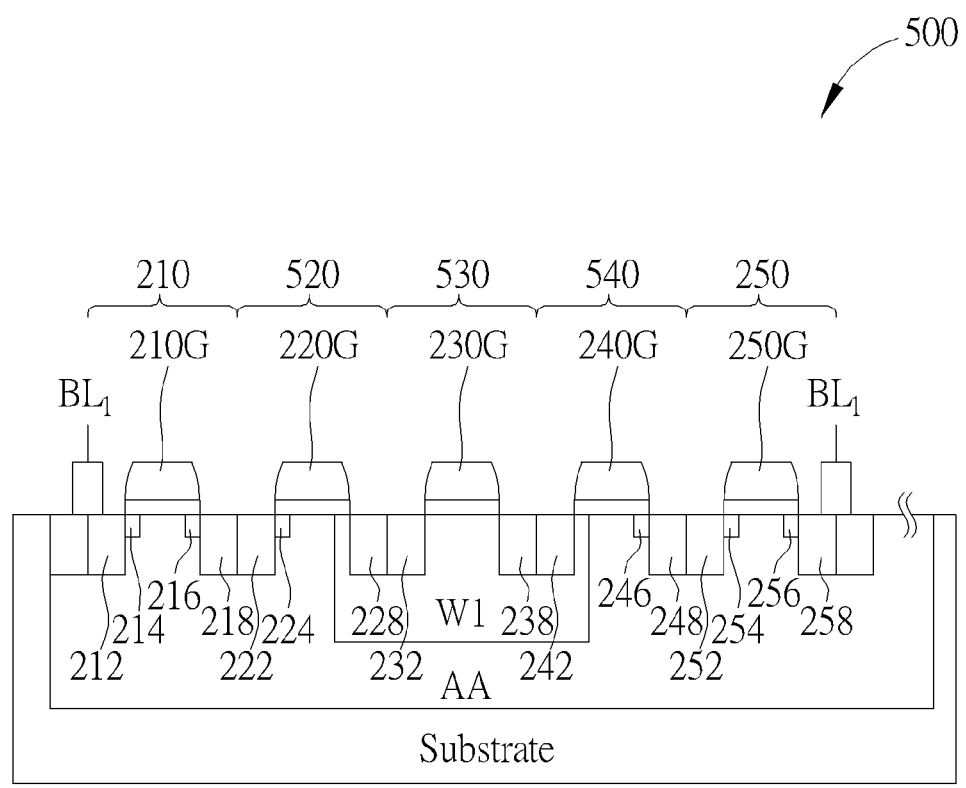
FIG. 11 shows a structure of the memory cell according to another embodiment of the present invention.

FIG. 11 shows a structure of the memory cell 500 according to one embodiment of the present invention. The memory cells 500 and $200_{1,1}$ have similar structures. The main difference between the two memory cells is in that the memory cell 500 includes the first select transistor 210, the first following gate transistor 520, the antifuse transistor 530, the second following gate transistor 540, and the second select transistor 250.

In FIG. 11, the second terminal 228 of the first following gate transistor 520, the first terminal 232 and the second terminal 238 of the antifuse transistor 530, and the first terminal 242 of the second following gate transistor 540 are disposed in a well W1. In some embodiments, the first select transistor 210, the first following gate transistor 520, the second select transistor 250, and the second following gate transistor 540 are formed by N-type metal-oxide-semiconductor field effect transistors, and the well W1 can be an N-well.

In this case, the antifuse transistor 530 is formed as an antifuse varactor. Also, since both the first terminal 212 of the first select gate 210 and the second terminal 258 of the second select gate 250 of the memory cell 500 are still coupled to the bit line $BL_1$, the memory cell 500 can be disposed in the same active area AA with other memory cells that are coupled to the same bit line $BL_1$. That is, memory cells disposed in the same column can still be disposed in the same active area. Therefore, when using the memory cell 500 to replace the memory cells $200_{1,1}$ to $200_{M,N}$ in the memory array 20, the total chip area can still be smaller than the memory array of prior art.

In addition, in the memory array 20, the gate oxide thickness of the gate terminal 210G of first select transistor 210, the gate oxide thickness of the gate terminal 220G of first following gate transistor 220, the gate oxide thickness of the gate terminal 230G of antifuse transistor 230, the gate oxide thickness of the gate terminal 240G of the second following gate transistor 240, and the gate oxide thickness of the gate terminal 250G of the second select transistor 250 are substantially the same.

However, in some embodiments, since the select transistors and the following gate transistors may receive external signals, the select transistors and the following gate transistors may be formed as input/output devices, which are capable of enduring higher voltages, while the antifuse transistor may be formed as a core device, which has a lower voltage endurance. In this case, the gate oxide thickness of the select transistors and the gate oxide thickness of the following gate transistors may be greater than the gate oxide thickness of the antifuse transistor.

Figure 12:
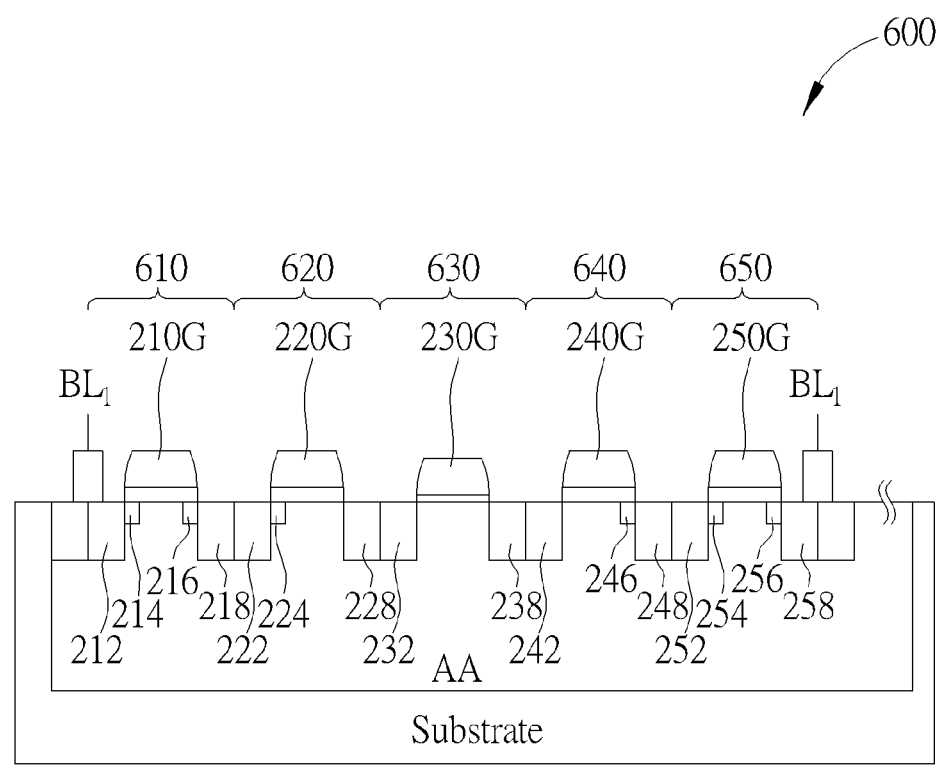
FIG. 12 shows a structure of the memory cell according to another embodiment of the present invention.

FIG. 12 shows a structure of the memory cell 600 according to one embodiment of the present invention. The memory cells 600 and $200_{1,1}$ have the similar structures. The main difference between the two memory cells is in that memory cell 600 includes the first select transistor 610, the first following gate transistor 620, the antifuse transistor 630, the second following gate transistor 640, and the second select transistor 650 while the gate oxide thickness of the gate terminal of the first select transistor 610, the gate oxide thickness of the gate terminal of the first following gate transistor 620, the gate oxide thickness of the gate terminal of the second following gate transistor 640, and the gate oxide thickness of the gate terminal of the second select transistor 650 are substantially the same and are greater than the gate oxide thickness of the gate terminal of the antifuse transistor 630. In this case, the memory cell 600 can be operated with signals of higher voltage than the memory cell $200_{1,1}$.

In summary, since each of the memory cells provided by the embodiments of the present invention can be coupled to the corresponding bit line through two different paths, the gate widths of the transistors of each memory cell can be reduced, and the memory cells coupled to the same bit line can be disposed in the same active region. Therefore, the total area of the memory arrays using the memory cells provided by the embodiments of the present invention can be significantly reduced without affecting the driving ability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
    a first select transistor having a first terminal coupled to a bit line, a second terminal, and a gate terminal coupled to a word line;
    a first following gate transistor having a first terminal coupled to the second terminal of the first select transistor, a second terminal, and a gate terminal coupled to a following control line;
    an antifuse transistor having a first terminal coupled to the second terminal of the first following gate transistor, a second terminal, and a gate terminal coupled to an antifuse control line;
    a second following gate transistor having a first terminal coupled to the second terminal of the antifuse transistor, a second terminal, and a gate terminal coupled to the following control line; and
    a second select transistor having a first terminal coupled to the second terminal of the second following gate transistor, a second terminal coupled to the bit line, and a gate terminal coupled to the word line.

2. The memory cell of claim 1, wherein:
    the first select transistor further comprises a first source/drain extension region coupled to the first terminal of the first select transistor and a second source/drain extension region coupled to the second terminal of the first select transistor, the first source/drain extension region and the second source/drain extension region of the first select transistor are disposed below the gate terminal of the first select transistor;
    the first following gate transistor further comprises a first source/drain extension region coupled to the first terminal of the first following gate transistor and below the gate terminal of the first following gate transistor;
    the second following gate transistor comprises a first source/drain extension region coupled to the second terminal of the second following gate transistor and below the gate terminal of the second following gate transistor; and
    the second select transistor comprises a first source/drain extension region coupled to the first terminal of the second select transistor and a second source/drain extension region coupled to the second terminal of the second select transistor, the first source/drain extension region and the second source/drain extension region of the second select transistor are disposed below the gate terminal of the second select transistor.

3. The memory cell of claim 2, wherein the antifuse transistor is a metal-oxide-semiconductor capacitor.

4. The memory cell of claim 2, wherein:
    the first following gate transistor further comprises a second source/drain extension region coupled to the second terminal of the first following gate transistor and below the gate terminal of the first following gate transistor;
    the antifuse transistor further comprises a first source/drain extension region coupled to the first terminal of the antifuse transistor and a second source/drain extension region coupled to the second terminal of the antifuse transistor, the first source/drain extension region and the second source/drain extension region of the antifuse transistor are disposed below the gate terminal of the antifuse transistor; and
    the second following gate transistor comprises a second source/drain extension region coupled to the first terminal of the second following gate transistor and below the gate terminal of the second following gate transistor.

5. The memory cell of claim 4, wherein the antifuse transistor is a metal-oxide-semiconductor capacitor.

6. The memory cell of claim 2, wherein:
    the first following gate transistor further comprises a modified source/drain extension region coupled to the second terminal of the first following gate transistor and below the gate terminal of the first following gate transistor;
    the antifuse transistor further comprises a modified source/drain extension region coupled to the first terminal and the second terminal of the antifuse transistor and below the gate terminal of the antifuse transistor; and
    the second following gate transistor comprises a modified source/drain extension region coupled to the first terminal of the second following gate transistor and below the gate terminal of the second following gate transistor.

7. The memory cell of claim 6, wherein the antifuse transistor is an antifuse varactor.

8. The memory cell of claim 2, wherein:
    the second terminal of the first following gate transistor, the first terminal and the second terminal of the antifuse transistor, and the first terminal of the second following gate transistor are disposed in a well.

9. The memory cell of claim 8, wherein:
    the first select transistor, the first following gate transistor, the second select transistor, and the second following gate transistor are formed by N-type metal-oxide-semiconductor field effect transistors; and
    the well is an N-well.

10. The memory cell of claim 8, wherein the antifuse transistor is an antifuse varactor.

11. The memory cell of claim 1, wherein a gate oxide thickness of the gate terminal of first select transistor, a gate oxide thickness of the gate terminal of first following gate transistor, a gate oxide thickness of the gate terminal of antifuse transistor, a gate oxide thickness of the gate terminal of second following gate transistor, and a gate oxide thickness of the gate terminal of second select transistor are substantially the same.

12. The memory cell of claim 1, wherein a gate oxide thickness of the gate terminal of first select transistor, a gate oxide thickness of the gate terminal of first following gate transistor, a gate oxide thickness of the gate terminal of second following gate transistor, and a gate oxide thickness of the gate terminal of second select transistor are substantially the same and are greater than a gate oxide thickness of the gate terminal of the antifuse transistor.

13. A memory array comprising a plurality of memory cells, each comprising:
    a first select transistor having a first terminal coupled to a bit line, a second terminal, and a gate terminal coupled to a word line;
    a first following gate transistor having a first terminal coupled to the second terminal of the first select transistor, a second terminal, and a gate terminal coupled to a following control line;
    an antifuse transistor having a first terminal coupled to the second terminal of the first following gate transistor, a second terminal, and a gate terminal coupled to an antifuse control line;

a second following gate transistor having a first terminal coupled to the second terminal of the antifuse transistor, a second terminal, and a gate terminal coupled to the following control line; and a second select transistor having a first terminal coupled to the second terminal of the second following gate transistor, a second terminal coupled to the bit line, and a gate terminal coupled to the word line;

wherein:

memory cells disposed in a same column are disposed in a same active area.

14. The memory cell of claim 13, wherein:

the first select transistor further comprises a first source/drain extension region coupled to the first terminal of the first select transistor and a second source/drain extension region coupled to the second terminal of the first select transistor, the first source/drain extension region and the second source/drain extension region of the first select transistor are disposed below the gate terminal of the first select transistor;

the first following gate transistor further comprises a first source/drain extension region coupled to the first terminal of the first following gate transistor and below the gate terminal of the first following gate transistor;

the second following gate transistor comprises a first source/drain extension region coupled to the second terminal of the second following gate transistor and below the gate terminal of the second following gate transistor; and the second select transistor comprises a first source/drain extension region coupled to the first terminal of the second select transistor and a second source/drain extension region coupled to the second terminal of the second select transistor, the first source/drain extension region and the second source/drain extension region of the second select transistor are disposed below the gate terminal of the second select transistor.

15. The memory array of claim 14, wherein the antifuse transistor is a metal-oxide-semiconductor capacitor.

16. The memory cell of claim 14, wherein:

the first following gate transistor further comprises a second source/drain extension region coupled to the second terminal of the first following gate transistor and below the gate terminal of the first following gate transistor;

the antifuse transistor further comprises a first source/drain extension region coupled to the first terminal of the antifuse transistor and a second source/drain extension region coupled to the second terminal of the antifuse transistor, the first source/drain extension region and the second source/drain extension region of the antifuse transistor are disposed below the gate terminal of the antifuse transistor; and the second following gate transistor comprises a second source/drain extension region coupled to the first terminal of the second following gate transistor and below the gate terminal of the second following gate transistor.

17. The memory array of claim 16, wherein the antifuse transistor is a metal-oxide-semiconductor capacitor.

18. The memory array of claim 14, wherein:

the first following gate transistor further comprises a modified source/drain extension region coupled to the second terminal of the first following gate transistor and below the gate terminal of the first following gate transistor;

the antifuse transistor further comprises a modified source/drain extension region coupled to the first terminal and the second terminal of the antifuse transistor and below the gate terminal of the antifuse transistor; and the second following gate transistor comprises a modified source/drain extension region coupled to the first terminal of the second following gate transistor and below the gate terminal of the second following gate transistor.

19. The memory array of claim 18, wherein the antifuse transistor is an antifuse varactor.

20. The memory array of claim 14, wherein:

the second terminal of the first following gate transistor, the first terminal and the second terminal of the antifuse transistor, and the first terminal of the second following gate transistor are disposed in a well.

21. The memory array of claim 20, wherein:

the first select transistor, the first following gate transistor, the second select transistor, and the second following gate transistor are formed by N-type metal-oxide-semiconductor field effect transistors; and the well is an N-well.

22. The memory array of claim 21, wherein the antifuse transistor is an antifuse varactor.

23. The memory array of claim 13, wherein a gate oxide thickness of the gate terminal of first select transistor, a gate oxide thickness of the gate terminal of first following gate transistor, a gate oxide thickness of the gate terminal of antifuse transistor, a gate oxide thickness of the gate terminal of second following gate transistor, and a gate oxide thickness of the gate terminal of second select transistor are substantially the same.

24. The memory array of claim 13, wherein a gate oxide thickness of the gate terminal of first select transistor, a gate oxide thickness of the gate terminal of first following gate transistor, a gate oxide thickness of the gate terminal of second following gate transistor, and a gate oxide thickness of the gate terminal of second select transistor are substantially the same and are greater than a gate oxide thickness of the gate terminal of antifuse transistor.

25. The memory array of claim 13, wherein:

memory cells disposed in a same row are coupled to a same antifuse control line, a same following control line, a same word line, and different bit lines; and memory cells disposed in a same column are coupled to different antifuse control lines, different word lines, the same following control line, and a same bit line.

26. The memory array of claim 25, wherein:

during a program operation of the memory cell:

the word line is in a range from a first voltage to a second voltage;

the following control line in a range from the second voltage to a third voltage;

the antifuse control line is at the third voltage; and the bit line is at a fourth voltage; and the third voltage is greater than the second voltage, the second voltage is greater than the first voltage, and the first voltage is greater than the fourth voltage.

27. The memory array of claim 26, wherein:

during the program operation of the memory cell:

a bit line coupled to an unselected memory cell disposed in a same row as the memory cell is at the first voltage.

28. The memory array of claim 26, wherein:
during the program operation of the memory cell:
- a word line coupled to an unselected memory cell disposed in a same column as the memory cell is at the fourth voltage; and
- an antifuse control line coupled to the unselected memory cell is at the fourth voltage.

29. The memory array of claim 25, wherein:
during a read operation of the memory cell:
- the word line is at a first voltage;
- the following control line is at the first voltage;
- the antifuse control line is in a range from the first voltage to a second voltage; and
- the bit line is at a fourth voltage; and
the second voltage is greater than the first voltage, and the first voltage is greater than the fourth voltage.

30. The memory array of claim 29, wherein:
during the read operation of the memory cell:
- a bit line coupled to an unselected memory cell disposed in a same row as the memory cell is at the first voltage.

31. The memory array of claim 29, wherein:
during the read operation of the memory cell:
- a word line coupled to an unselected memory cell disposed in a same column as the memory cell is at the fourth voltage; and
- an antifuse control line coupled to the unselected memory cell is at the fourth voltage.

32. The memory array of claim 25, wherein:
during a reverse read operation of the memory cell:
- the word line is in a range from a first voltage to a second voltage;
- the following control line in a range from the first voltage to the second voltage;
- the antifuse control line is at a fourth voltage; and
- the bit line is in a range from the first voltage to the second voltage; and
the second voltage is greater than the first voltage, and the first voltage is greater than the fourth voltage.

33. The memory array of claim 32, wherein:
during the reverse read operation of the memory cell:
- a bit line coupled to an unselected memory cell disposed in a same row as the memory cell is at the fourth voltage.

34. The memory array of claim 32, wherein:
during the reverse read operation of the memory cell:
- a word line coupled to an unselected memory cell disposed in a same column as the memory cell is at the fourth voltage; and
- an antifuse control line coupled to the unselected memory cell is at the fourth voltage.

* * * * *